(12) United States Patent
Jeon et al.

(10) Patent No.: US 11,854,463 B2
(45) Date of Patent: Dec. 26, 2023

(54) DATA DRIVING INTEGRATED CIRCUIT AND METHOD OF DRIVING THE SAME

(71) Applicant: LX Semicon Co., Ltd., Daejeon (KR)

(72) Inventors: Jae Uk Jeon, Daejeon (KR); Man Jeong Ko, Daejeon (KR); Byung Seob Song, Daejeon (KR); Jung Bae Yun, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 7 days.

(21) Appl. No.: 17/837,784

(22) Filed: Jun. 10, 2022

(65) Prior Publication Data
US 2022/0398972 A1 Dec. 15, 2022

(30) Foreign Application Priority Data
Jun. 14, 2021 (KR) .................. 10-2021-0076541

(51) Int. Cl.
*G09G 3/22* (2006.01)
*H03M 1/66* (2006.01)

(52) U.S. Cl.
CPC .............. *G09G 3/22* (2013.01); *H03M 1/66* (2013.01); *G09G 2310/0243* (2013.01); *G09G 2330/02* (2013.01)

(58) Field of Classification Search
CPC .............. G09G 3/22; G09G 2330/02; G09G 2310/0243; H03M 1/66
See application file for complete search history.

(56) References Cited

U.S. PATENT DOCUMENTS

2013/0257637 A1* 10/2013 Gotoh ................ H03F 3/04
330/252

FOREIGN PATENT DOCUMENTS

KR 10-2140250 B1 7/2020

* cited by examiner

*Primary Examiner* — Priyank J Shah
(74) *Attorney, Agent, or Firm* — POLSINELLI PC

(57) ABSTRACT

A data driving integrated circuit of the present embodiment may include a digital to analog converter configured to change a digital signal into an analog signal and an amplifier configured to receive the analog signal through an input terminal and output a data voltage to a pixel connected to a data line, wherein the amplifier may receive, as feedback, one of a plurality of output signals from a plurality of output terminals.

15 Claims, 14 Drawing Sheets

| Block | Operation | Node 1 | Node 2 |
|---|---|---|---|
| Inverting gain circuit | normal | L | L |
| | | L | H |
| | | H | H |
| | high impedance | H | L |

| Block | Operation | Node 3 | Node 4 |
|---|---|---|---|
| High impedance operation | normal | H | H |
| | High impedance | H | L |

DATA DRIVING INTEGRATED CIRCUIT AND METHOD OF DRIVING THE SAME

CROSS REFERENCE TO RELATED APPLICATION

This application claims priority from Republic of Korea Patent Application No. 10-2021-0076541 filed on Jun. 14, 2021, which is hereby incorporated by reference in its entirety.

BACKGROUND

1. Field of Technology

The present embodiment relates to a data driving integrated circuit for driving a panel and a display device including the same.

2. Description of the Prior Art

A display device may include a panel, a data driving circuit for driving the panel and a timing controller for controlling the driving of the data driving circuit.

The timing controller may transmit driving control data and image data to the data driving circuit, and may control driving timing of a panel of the data driving circuit based on the driving control data.

The data driving circuit may drive a plurality of pixels in one line. The data driving circuit may generate an image signal from image data in order to drive a plurality of pixels of the panel. The data driving circuit may include a digital to analog converter (DAC) and a buffer therein. The DAC may generate a data voltage, that is, an analog signal, by receiving the image data. The buffer may output the data voltage to a pixel through a plurality of data lines connected to the panel.

A conventional data driving circuit controls the output of the data driving circuit in a way to block or connect the output of the data voltage, transmitted to a pixel through the buffer, through an external switch connected to the output terminal of the buffer.

In a conventional data driving circuit, the output driving of the buffer may be limited because a switch or a multiplexer needs to be separately installed outside the buffer.

Furthermore, in a conventional data driving circuit, a quiescent current of the buffer is generated because an output is blocked through the switch outside the amplifier at timing after the driving of the buffer in order to implement high impedance.

SUMMARY OF THE INVENTION

Under such a background, in one aspect, various embodiments are directed to providing a data driving circuit capable of reducing the size of a buffer within a data driving circuit and reducing the generation of a quiescent current of the buffer, and a display device including the same.

Under such a background, in another aspect, various embodiments are directed to providing a data driving circuit capable of providing a high impedance function while maintaining the existing buffer function by including, in an amplifier, a switch or multiplexer of the data driving circuit disposed outside a buffer, and a display device including the same.

In an aspect, the present embodiment may provide a data driving integrated circuit including a digital to analog converter (DAC) configured to convert a digital signal into an analog signal and an amplifier configured to generate data voltage through a folded cascode gain circuit and an inverting gain circuit by using the analog signal received through an input terminal and to output the data voltage. The folded cascode gain circuit may receive one of a plurality of output voltages of the amplifier. The inverting gain circuit may receive an output signal of the folded cascode gain circuit, and may change a signal, transferred to a transistor connected to an output terminal through a multiplexer disposed within the inverting gain circuit. In the data driving integrated circuit, the multiplexer within the inverting gain circuit may be connected to the transistor in a way to form a common node, and may control a source voltage, drain voltage or gate voltage of the transistor.

In the data driving integrated circuit, the multiplexer may change a gate voltage transferred to the transistor and change an output voltage of the amplifier based on a set criterion.

In the data driving integrated circuit, the multiplexer may include a first multiplexer and a second multiplexer. The first multiplexer may be connected to a P type transistor. The second multiplexer may be connected to an N type transistor. The first multiplexer and the second multiplexer may independently control output voltages of the amplifier.

In the data driving integrated circuit, the inverting gain circuit may include a P type transistor and an N type transistor, and may change an output voltage of the amplifier by controlling a current between the P type transistor and the N type transistor. A multiplexer connected to the N type transistor may transfer a ground voltage to the N type transistor.

In the data driving integrated circuit, the inverting gain circuit may form a plurality of output terminals by a plurality of transistor groups connected in parallel.

The data driving integrated circuit may further include an external multiplexer configured to select one or more of voltages outputted from the output terminal of the amplifier and provide a feedback voltage to the input terminal of the amplifier.

In the data driving integrated circuit, the amplifier may include a first output terminal and a second output terminal. One line connected to the first output terminal may transfer the data voltage to a pixel and the other line may transfer the data voltage to an external multiplexer. A line connected to the second output terminal may transfer the data voltage to the external multiplexer. The external multiplexer may select any one of a voltage received from the first output terminal and a voltage received from the second output terminal.

In another aspect, an operational amplifier may include a plurality of output terminals configured to transfer a data voltage. Each of the plurality of output terminals may include a P type transistor having a source electrode connected to a first line and a gate electrode connected to a second line and an N type transistor having a source electrode connected to a third line and a gate electrode connected to a fourth line. The plurality of output terminals may form an output voltage path to a node to which the P type transistor and the N type transistor are connected. Output voltages of the plurality of output terminals may be controlled by multiplexers disposed in the second line and the fourth line, respectively, and disposed within the operational amplifier.

In the operational amplifier, the multiplexer may control an output voltage of the output terminal by receiving a signal to control the P type transistor or the N type transistor.

In the operational amplifier, the multiplexer may be connected to the P type transistor or the N type transistor, and may select a voltage transferred to the P type transistor or the N type transistor.

In the operational amplifier, the output voltage path formed by the operational amplifier may include a first output voltage path for transferring a feedback voltage to an input terminal of the amplifier, and a second output voltage path for transferring a data voltage to a pixel.

In the operational amplifier, one of the plurality of output terminals may be electrically connected to an external multiplexer disposed outside the operational amplifier. Another of the plurality of output terminals may be electrically connected to the external multiplexer and also connected to a plurality of pixels, and transfer a data voltage.

In still another aspect, an operational amplifier may include a first multiplexer configured to select an input voltage transferred to an operational amplifier through a (−) terminal of an input terminal, a folded cascode gain circuit connected to the (−) terminal and (+) terminal of the input terminal and configured to change a gain of the input voltage, a first inverting gain circuit configured to generate an output voltage by transferring, to a first transistor, a voltage transferred by the folded cascode gain circuit, and a second inverting gain circuit configured to share a voltage node with the first inverting gain circuit and including g a multiplexer that changes a voltage transferred to a second transistor.

In the operational amplifier, an output voltage of an output terminal of the operational amplifier may be controlled by a third multiplexer connected to the first transistor.

As described above, according to the present embodiment, a limit to the output driving of the amplifier can be reduced and the size of the data driving circuit can be reduced by including the multiplexer in the amplifier of the buffer within the data driving circuit.

As described above, according to the present embodiment, a quiescent current consumed in the data driving circuit can be reduced.

As described above, according to the present embodiment, the buffer which provides a high impedance function in the data driving circuit can be provided.

BRIEF DESCRIPTION OF THE DRAWINGS

FIG. 11 is a first example diagram illustrating the type of operation of a data driving circuit according to an embodiment.

FIG. 12 is a second example diagram illustrating the type of operation of a data driving circuit according to an embodiment.

DETAILED DESCRIPTION OF THE EXEMPLARY EMBODIMENTS

Figure 1:
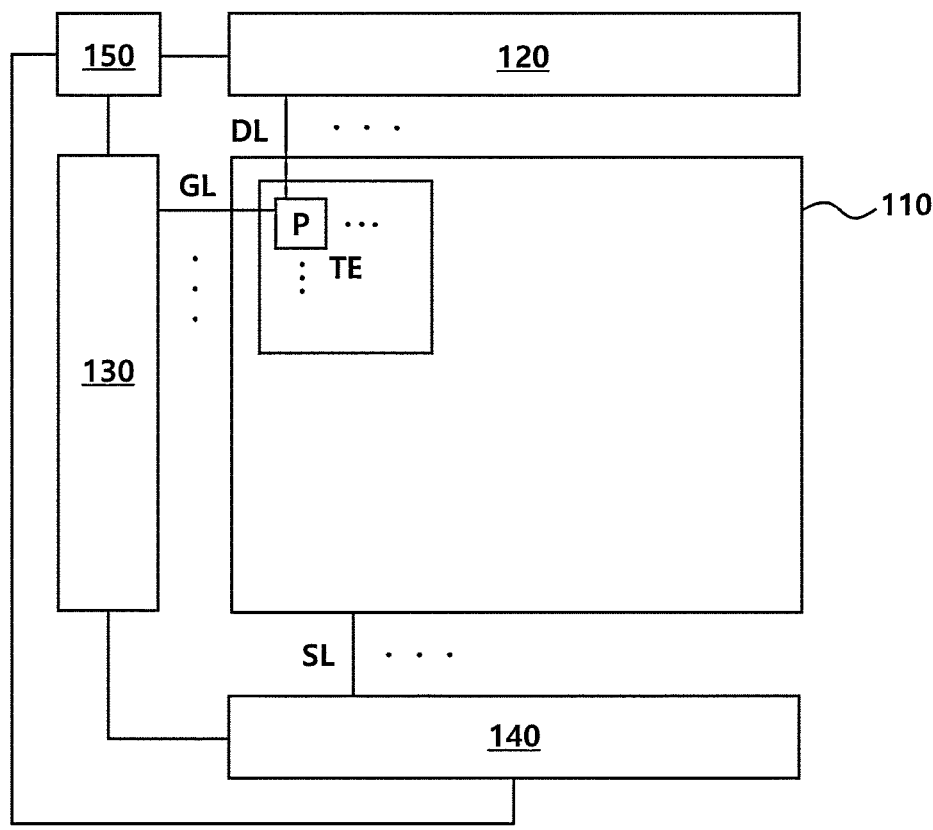
FIG. 1 is a configuration diagram of a general display device.

FIG. 1 is a configuration diagram of a general display device.

Referring to FIG. 1, a display device 100 may include a panel 110, a data driving circuit 120, a gate driving circuit 130, a touch sensing circuit 140, a control circuit 150, etc.

A plurality of data lines DL connected to the data driving circuit 120 may be formed in the panel 110. A plurality of gate lines GL connected to the gate driving circuit 130 may be formed in the panel 110. Furthermore, multiple pixels P corresponding to intersections of the plurality of data lines DL and the plurality of gate lines GL may be defined in the panel 110.

A transistor having a first electrode (e.g., a source electrode or a drain electrode) connected to the data line DL, a gate electrode connected to the gate line GL, and a second electrode (e.g., the drain electrode or the source electrode) connected to a display electrode may be formed in each pixel P.

The panel 110 may include a display panel and a touch screen panel (TSP). In this case, the display panel and the TSP may share some elements.

The data driving circuit 120 may supply a data signal to the data line DL in order to display an image in each pixel P of the panel 110.

The data driving circuit 120 may include at least one data driving integrated circuit. The at least one data driving integrated circuit may be directly formed in the panel 110. In some cases, the at least one data driving integrated circuit may be integrated and formed in the panel 110. The data driving circuit 120 may be defined as a source driver or a source driver integrated circuit, if necessary.

The gate driving circuit 130 may sequentially supply a scan signal to the gate line GL in order to turn on or off the transistor disposed in each pixel P. When the scan signal having a turn-on voltage is supplied to the pixel P, the pixel P may be connected to the data line DL. When the scan signal having a turn-off voltage is supplied to the pixel P, the pixel P may be disconnected from the data line DL.

The touch sensing circuit 140 may obtain touch sensing data by applying a driving signal to some or all of a plurality of touch electrodes TE connected to a sensing line SL.

The control circuit 150 may supply various types of control signals to the data driving circuit 120, the gate driving circuit 130 and the touch sensing circuit 140.

The control circuit 150 may transmit a data control signal DCS that controls the data driving circuit 120 to supply a data voltage to each pixel P at each timing, may transmit a gate control signal GCS to the gate driving circuit 130, or may transmit a sensing signal to the touch sensing circuit 140. The control circuit 150 may be a timing controller T-Con or may include a timing controller and further perform another control function.

Figure 2:
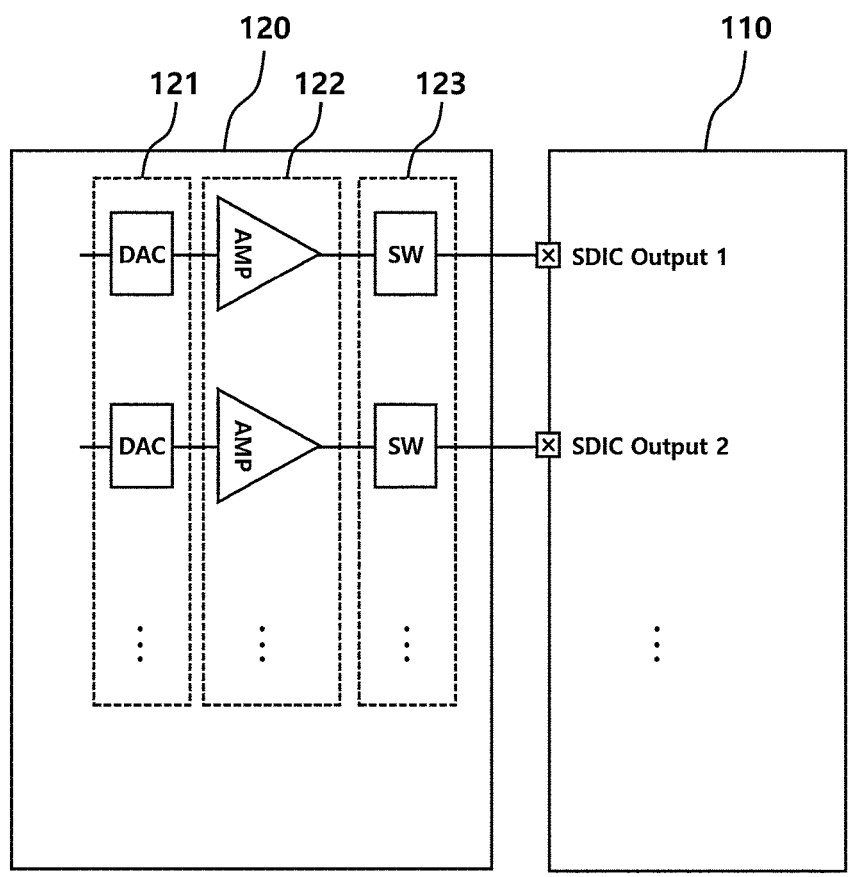
FIG. 2 is a diagram for describing a configuration in which a data voltage is transmitted to a panel in a conventional data driving circuit.

FIG. 2 is a diagram for describing a configuration in which a data voltage is transmitted to the panel in the conventional data driving circuit.

Referring to FIG. 2, the data driving circuit 120 may include a DAC 121, a buffer 122, a switch 123, etc.

The DAC 121 may receive image data having a digital form and convert the image data into an analog signal.

The buffer 122 may receive an analog signal from the DAC 121, may amplify the analog signal, and may supply the amplified signal to the data line DL. Furthermore, the buffer 122 may receive a bias current from a bias control circuit (not illustrated), and may output a data voltage.

The buffer 122 may be defined as a buffer amplifier or an amplifier, if necessary. For example, the amplifier may be an operational amplifier (OP-amplifier).

The switch 123 may be electrically connected to the output terminal of the buffer 122, and may transfer the output of the buffer 122 to the panel 110 through the data line DL or block the output of the buffer 122. The driving of the switch 123 may be based on a control signal received from the control circuit 150.

The switch 123 is connected at timing after the output driving of the buffer 122. Accordingly, although the output of the buffer 122 is transferred to the panel 110, a quiescent current is always present.

Furthermore, the switch 123 includes a resistor therein, and thus a quiescent current is generated even in an high impedance condition, for example, even in the state in which the switch is open or the state in which resistance of the switch is increased or a small amount of current is permitted.

The switch 123 may be formed by integrating a plurality of switches. A multiplexer which receives various types of signals and selects one or more signals may be used instead of the switch 123. The multiplexer may be defined as a MUX, if necessary.

In order to transfer an output voltage from the conventional data driving circuit 120 to the panel 110, the buffer 122 and an external switch or external multiplexer connected to the buffer 122 must be combined and driven. For this reason, a reduction in the size of the data driving circuit is limited.

Figure 3:
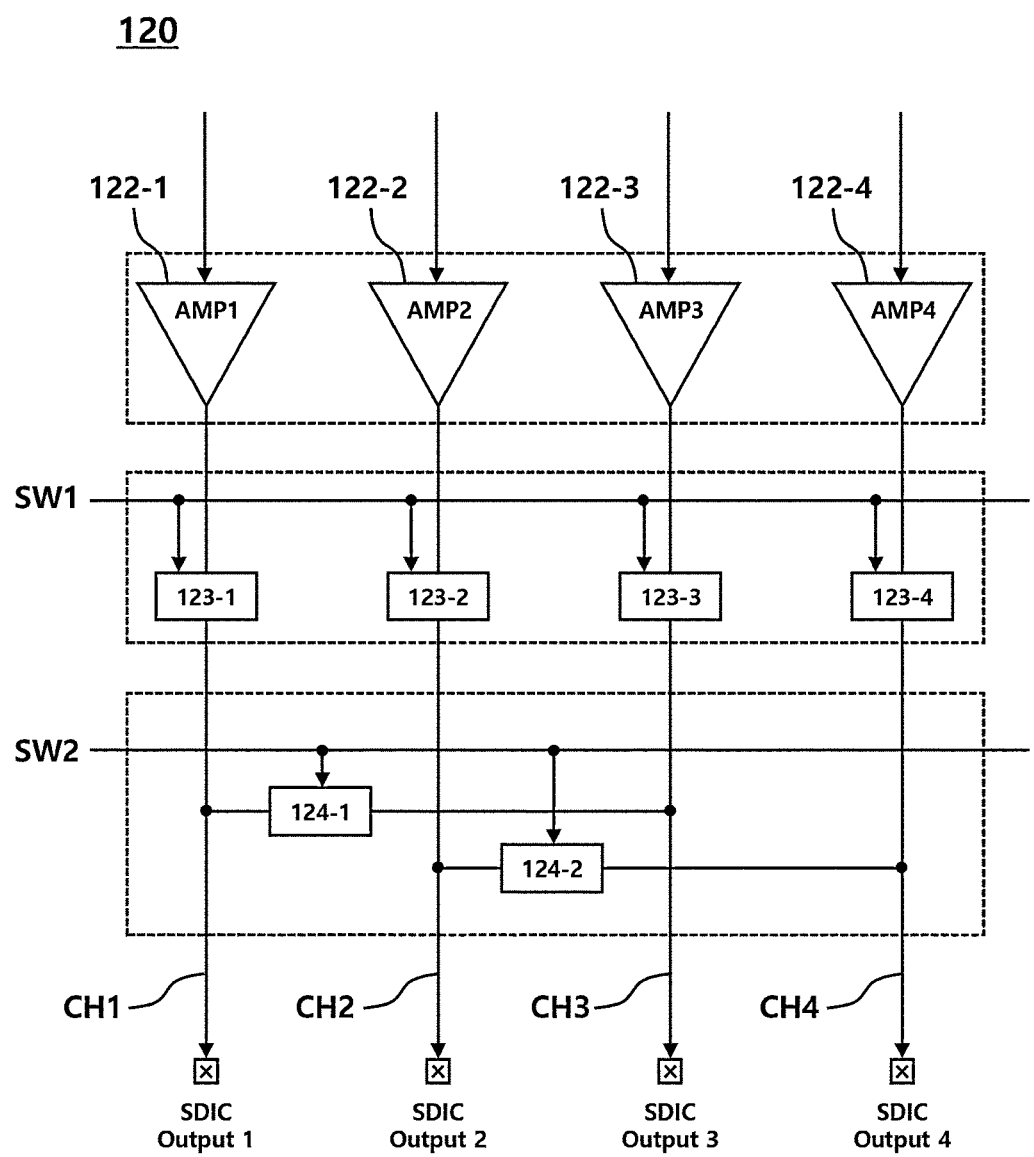
FIG. 3 is a block diagram for describing a configuration of the conventional data driving circuit.

FIG. 3 is a block diagram for describing a configuration of the conventional data driving circuit.

Referring to FIG. 3, the conventional data driving circuit 120 may include a plurality of operational amplifiers 122-1, 122-2, 122-3 and 122-4, first switch groups 123-1, 123-2, 123-3 and 123-4, second switch groups 124-1 and 124-2, etc.

The plurality of operational amplifiers 122-1, 122-2, 122-3 and 122-4 may include a first operational amplifier 122-1 to a fourth operational amplifier 122-4, and may be connected to correspond to a first output terminal SDIC Output 1 to a fourth output terminal SDIC Output 4, respectively.

Channels CH1 to CH4 may be connected to corresponding data lines through the output terminals, respectively.

The operational amplifiers 122-1, 122-2, 122-3 and 122-4 may transfer data voltages to the data lines through the channels CH1 to CH4, respectively.

The first switch groups 123-1, 123-2, 123-3 and 123-4 and the second switch groups 124-1 and 124-2 may be disposed between the plurality of operational amplifiers 122-1, 122-2, 122-3 and 122-4 and the plurality of output terminals, and may be turned on/off.

The first switch groups 123-1, 123-2, 123-3 and 123-4 may include a first switch 123-1 to a fourth switch 123-4. Each of the switches may be controlled by the control circuit (not illustrated). A switching signal SW1 transferred by the control circuit (not illustrated) may be a source output enable signal SOE or an inverted signal thereof.

The second switch groups 124-1 and 124-2 may include a first charge sharing switch 124-1 and a second charge sharing switch 124-2. Each of the charge sharing switches may be controlled by the control circuit (not illustrated).

The second switch groups 124-1 and 124-2 may connect the multiple channels CH1 to CH4 through which data voltages having the same polarity are provided. For example, the first charge sharing switch 124-1 may be connected between the first channel CH1 and the third channel CH3. The second charge sharing switch 124-2 may be connected between the second channel CH2 and the fourth channel CH4.

The first charge sharing switch 124-1 and the second charge sharing switch 124-2 may be turned on/off depending on an operation section in response to the second switching signal SW2. For example, in a first section (e.g., a normal display section), both the first charge sharing switch 124-1 and the second charge sharing switch 124-2 may be turned off. Furthermore, in a second section (e.g., a blank section), both the first charge sharing switch 124-1 and the second charge sharing switch 124-2 may be turned on. That is, the first charge sharing switch 124-1 may electrically disconnect the first channel CH1 and the third channel CH3. The second charge sharing switch 124-2 may electrically disconnect the second channel CH2 and the fourth channel CH4.

The conventional data driving circuit 120 also has the aforementioned problem because it needs to include the first switch groups 123-1, 123-2, 123-3 and 123-4, the second switch groups 124-1 and 124-2, etc. outside the operational amplifier circuit or outside the data driving integrated circuit in order to prevent a charge sharing phenomenon.

Figure 4:
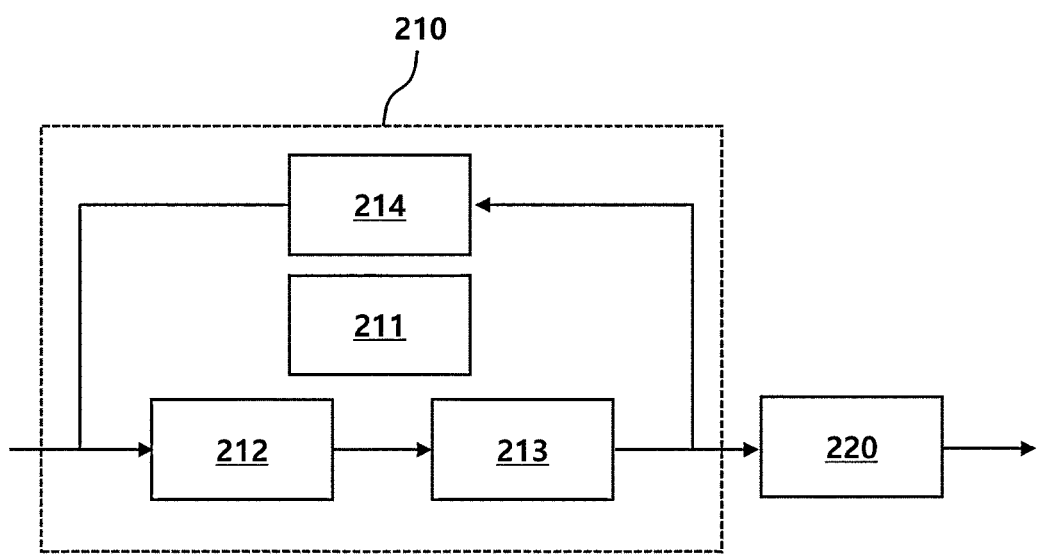
FIG. 4 is a block diagram illustrating a construction of an amplifier and a switch within the conventional data driving circuit.

FIG. 4 is a block diagram illustrating a construction of an amplifier and a switch within the conventional data driving circuit.

Referring to FIG. 4, an amplifier 210 may include a bias supply circuit 211, a folded cascode gain circuit 212, an inverting gain circuit 213, a feedback circuit 214, etc.

The bias supply circuit 211 may independently supply a bias voltage or current to the amplifier within the data driving circuit.

The folded cascode gain circuit 212 may include a cascode current mirror, a cascode current source, etc., may be connected to a (−) input terminal and (+) input terminal of the amplifier, and may receive an analog signal.

Figure 8:
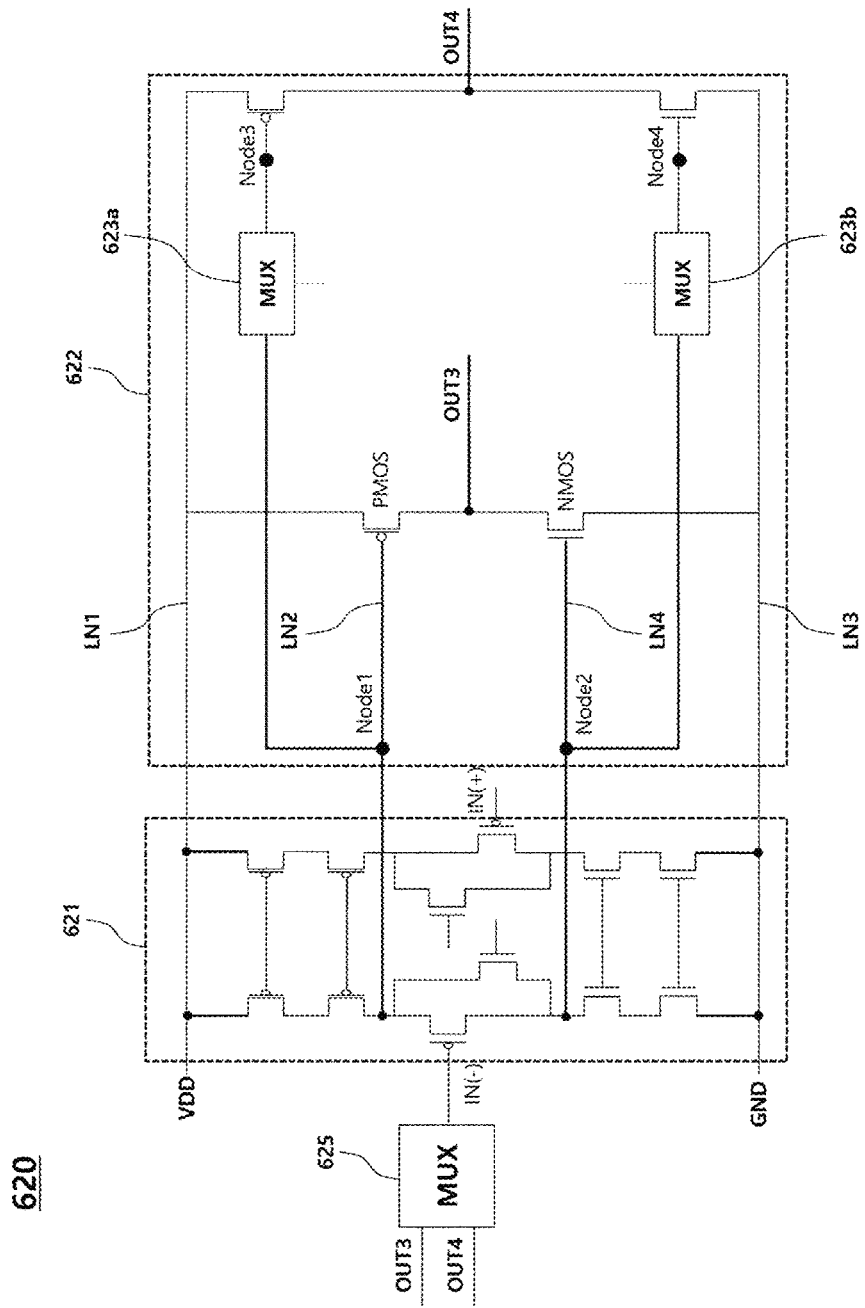
FIG. 8 is a first example circuit diagram illustrating an operational amplifier within a data driving circuit according to an embodiment.

The folded cascode gain circuit may be a folded cascode gain circuit which has a form disclosed in FIG. 8 and includes a plurality of P type transistors and N type transistors.

The inverting gain circuit 213 may be connected to the folded cascode gain circuit 212, and may transfer an inverted gain to the outside of the amplifier. The inverting gain circuit may be a circuit in which a P type transistor and an N type transistor are connected.

The conventional inverting gain circuit 213 forms only one output, and thus generates an output voltage by only the pair of P type transistor and N type transistor.

The feedback circuit 214 may receive the output of the inverting gain circuit 213 and transfer the output to the input terminal of the amplifier.

The conventional feedback circuit 214 has problems in that the type of feedback voltage cannot be selected because the feedback circuit transfers only one output to the input terminal of the amplifier and stability is low because the feedback circuit sensitively responds to a change in the voltage of the output terminal.

The multiplexer 220 is connected to the output terminal of the amplifier outside of the amplifier 210 and configured as a separate circuit, and includes a resistor. The multiplexer 220 is disposed outside a data driving integrated circuit (not illustrated), and receives the output of the amplifier or blocks the output of the amplifier. The multiplexer 220 may receive output signals from a plurality of amplifiers, and may operate as a switch when receiving an output signal from one amplifier. The multiplexer 220 may be defined as a MUX, if necessary.

A case where the multiplexer 220 blocks an output by turning off the switch may be defined as a high impedance state.

The amplifier 210 and the multiplexer 220 within the data driving circuit are treated as separate elements, and need to receive separate control signals from the timing controller. Furthermore, if a data voltage is not transferred to the panel outside the data driving circuit or even in the high impedance condition, total power consumption of a display device is increased because a quiescent current is generated within the amplifier 210.

Figure 5:
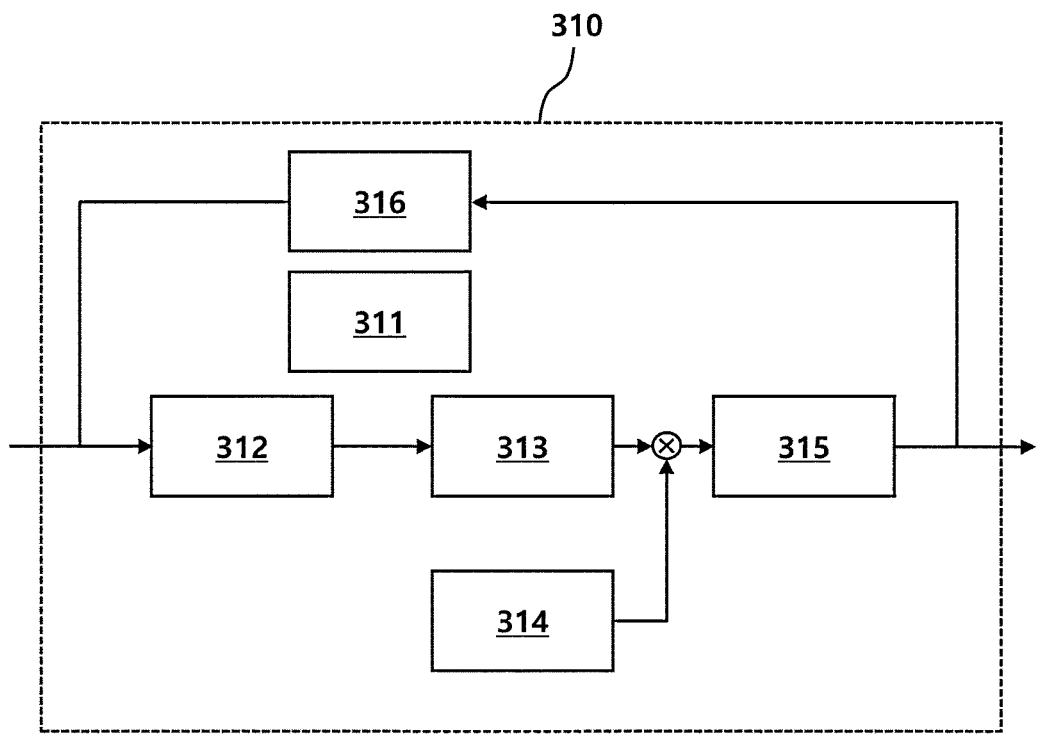
FIG. 5 is a first example block diagram illustrating an amplifier within a data driving circuit according to an embodiment.

FIG. 5 is a first example block diagram illustrating an amplifier within a data driving circuit according to an embodiment.

Referring to FIG. 5, an amplifier 310 may include a bias supply circuit 311, a folded cascode gain circuit 312, an inverting gain circuit 313, a high impedance driving circuit 314, an output selection circuit 315, a feedback circuit 316, etc.

The bias supply circuit 311 may independently supply a bias voltage or current to the amplifier within the data driving circuit.

The folded cascode gain circuit 312 may include a cascode current mirror, a cascode current source, etc., and may be a folded cascode gain circuit which is described with reference to FIG. 4 and changes a gain of an input voltage.

The inverting gain circuit 313 may be connected to the folded cascode gain circuit 312, and may transfer an inverted gain to the outside of the amplifier. The inverting gain circuit may be a circuit in which a P type transistor and an N type transistor are connected.

The inverting gain circuit 313 according to an embodiment may generate a plurality of outputs. Several pairs of the P type transistor and the N type transistor may constitute a plurality of output terminals of the amplifier 310. For example, the plurality of output terminals may be terminals to transmit output signals from the amplifier 310.

The output of the amplifier 310 can be more stably transferred because one or more of output voltages transferred by the plurality of output terminals are selectively fed back or are selectively transferred to a pixel.

The inverting gain circuit 313 may include a first inverting gain circuit configured to generate an output voltage by transferring, to a first transistor, a voltage received from the folded cascode gain circuit and a second inverting gain circuit configured to share a voltage node with the first inverting gain circuit and including a multiplexer that changes a voltage transferred to a second transistor.

The high impedance driving circuit 314 may perform an operation of distinguishing between a normal operation signal and a high impedance operation signal and changing the output of the data driving circuit in a high impedance state.

The high impedance driving circuit 314 may further include an additional driving transistor (not illustrated) configured to receive the normal operation signal. The additional driving transistor (not illustrated) may be a circuit configuration formed separately from the high impedance driving circuit 314. The additional driving transistor can also be integrated with the high impedance driving circuit 314.

The additional driving transistor (not illustrated) may control a current between an NMOS transistor and a PMOS transistor.

The high impedance driving circuit 314 may be a circuit configuration formed separately from the amplifier 310, if necessary, and may be controlled by a timing controller (not illustrated).

The output selection circuit 315 may individually select outputs according to a normal operation and a high impedance operation. The output selection circuit 315 may include one or more multiplexers (not illustrated) and select an output signal.

The feedback circuit 316 may receive an output selected by the output selection circuit 315 and transfer the output to the input terminal of the amplifier.

The feedback circuit 316 may selectively receive the output signal of the high impedance driving circuit 314 and an output signal by the additional driving transistor (not illustrated).

If an external OUT MUX function is included as a circuit configuration within the amplifier, the area of the data driving circuit can be reduced from a viewpoint of the layout of the circuit. Furthermore, communication efficiency can be increased by transferring, to a single buffer or amplifier, a control signal transferred from a timing controller T-Con without individually transferring the control signal to the OUT MUX and the amplifier.

Figure 6:
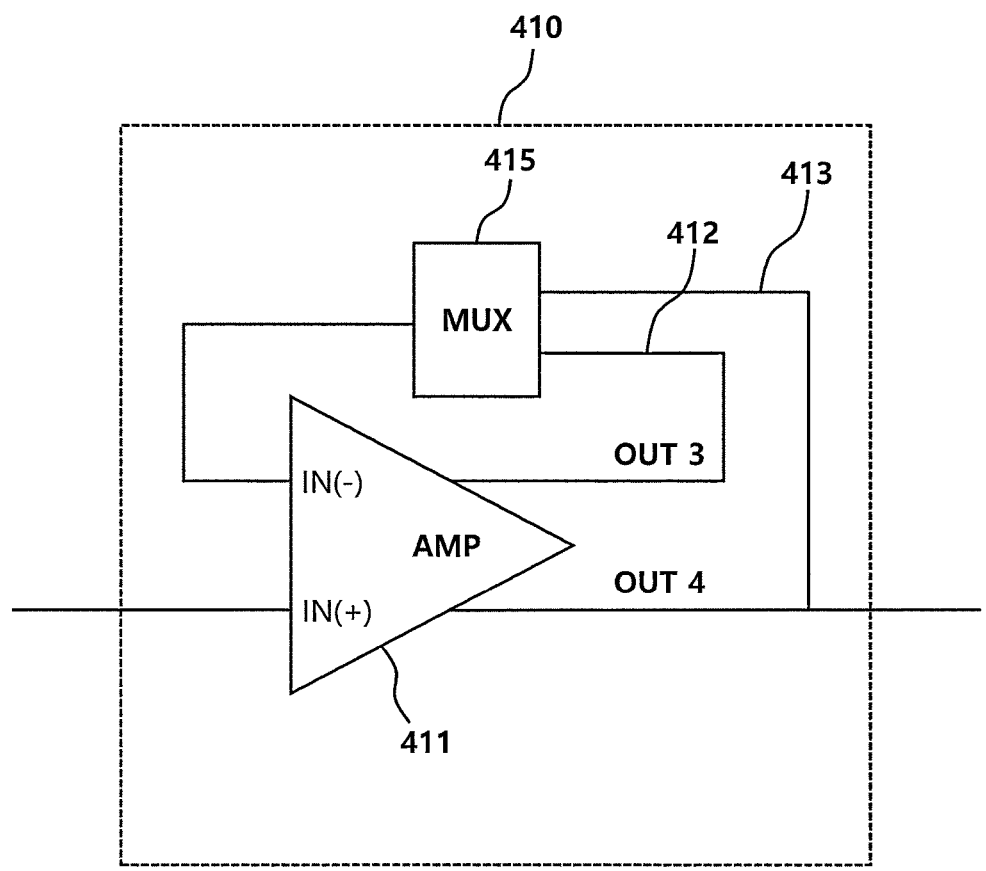
FIG. 6 is a second example block diagram illustrating an amplifier within a data driving circuit according to an embodiment.

FIG. 6 is a second example block diagram illustrating an amplifier within a data driving circuit according to an embodiment.

Referring to FIG. 6, a buffer 410 may include an operational amplifier 411 and a multiplexer 415.

The operational amplifier 411 may transfer a first output OUT3 and a second output OUT4 to the multiplexer 415 through a first output line 412 and a second output line 413, respectively.

The multiplexer 415 may select the first output OUT3 received through the first output line 412 and the second output OUT4 received through the second output line 413, and may transfer the selected outputs to the input terminal of the amplifier 411.

The multiplexer 415 may be connected to the (−) input terminal of the amplifier, and may feed a select input back to the (−) input terminal thereof.

If the multiplexer 415 is structured to be connected to both the first output line 412 and the second output line 413, a high impedance state can be stably maintained compared to a structure in which an output is fed back to the amplifier through a single output line by the second output line 413. In the feedback process of the amplifier, an operating speed of a circuit for feedback based on a target set value can be rapidly performed.

Figure 7:
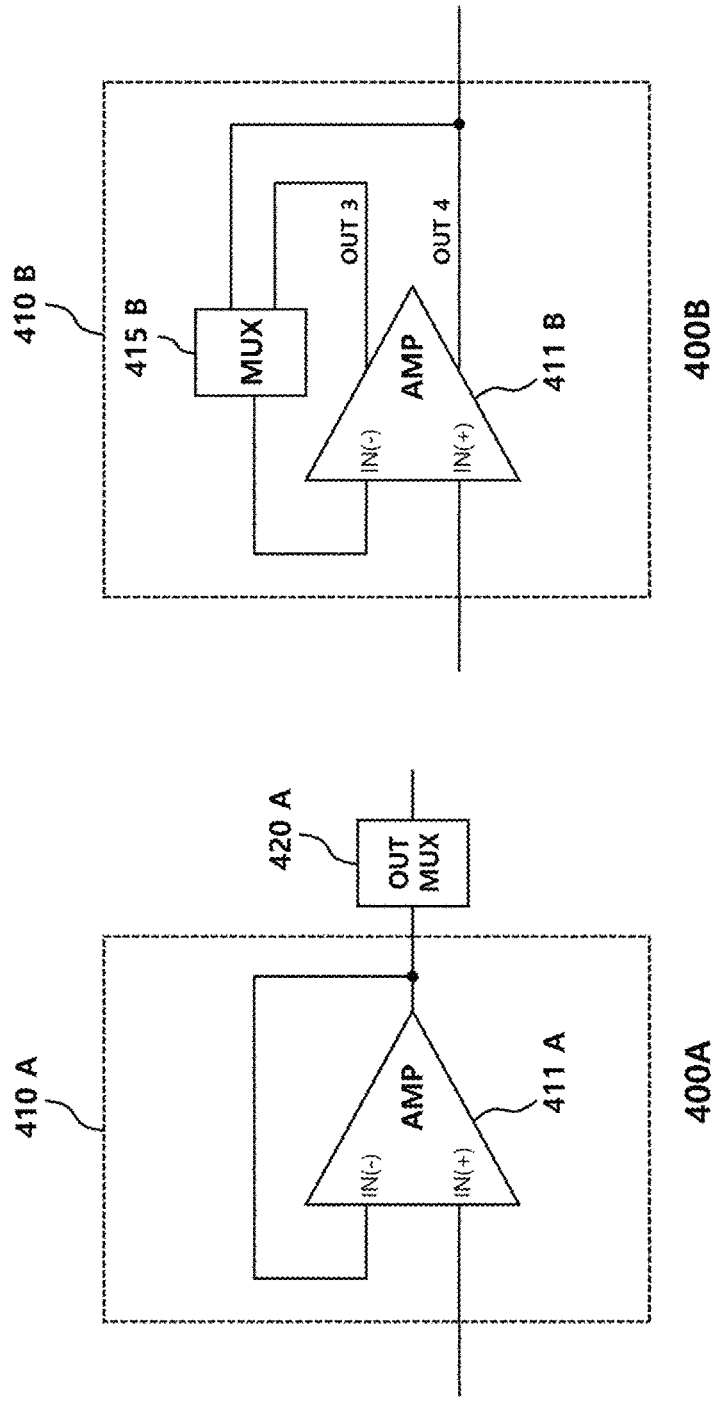
FIG. 7 is a diagram for comparing configurations of a conventional data driving circuit and a data driving circuit according to an embodiment.

FIG. 7 is a diagram for comparing configurations of a conventional data driving circuit and a data driving circuit according to an embodiment.

Referring to FIG. 7, configurations of a conventional data driving circuit 400A and a data driving circuit 400B according to an embodiment may be compared.

The conventional data driving circuit 400A transfers a data voltage to a pixel (not illustrated) of a panel by a buffer 410A and an OUT MUX 420A.

The OUT MUX 420A connected to the output terminal of an amplifier 411A within the buffer 410A transfers an output signal to the panel through a switch connection or blocks the output signal.

The buffer 410A and the OUT MUX 420A are separated from each other as separate circuit configurations, and have a configuration in which the OUT MUX 420A is connected to the buffer 410A at timing after the output driving of the amplifier 411A. Accordingly, the amplifier 411A operates regardless of whether the OUT MUX 420A switches.

A current is present within the conventional data driving circuit 400A due to the configuration having a combination of the buffer 410A and the OUT MUX 420A regardless of whether the amplifier 411A is used. Furthermore, there is a problem in that power consumption is increased because a quiescent current flows even in the high impedance condition.

In contrast, the data driving circuit 400B according to an embodiment can control the output of a data voltage by one or more MUXs (not illustrated) present within a buffer 410B.

The buffer 410B according to an embodiment may include an amplifier 411B, a multiplexer 415B, etc.

An output signal transferred to a panel may be adjusted by a separate MUX (not illustrated) included within the amplifier 411B. When the amplifier 411B does not transfer a data voltage to the panel, the amount of a quiescent current used can be reduced.

The amplifier 411B may have a structure in which an output is fed back by the multiplexer 415B.

The multiplexer 415B may select a first output OUT3 and second output OUT4 of the amplifier 411B, and may output the selected output. The type and number of outputs outputted by the amplifier 411B is not limited to the example of FIG. 7.

The stability and efficiency of the buffer 410B can be improved because even the second output OUT4 is fed back compared to a case where only the first output OUT3 of the amplifier 411B is fed back.

If a circuit configuration related to the first output OUT3 is broken or becomes unstable, the stability of a circuit can be improved because a connection with the second output OUT4 is maintained. Even in the opposite case, the stability of the circuit can be improved.

If the first output OUT3 and the second output OUT4 are selected and fed back or output values thereof are averaged and fed back, the processing speed of the circuit can be improved. For example, a speed converging on a target output value can be improved.

FIG. 8 is a first example circuit diagram illustrating an operational amplifier within a data driving circuit according to an embodiment.

Referring to FIG. 8, an operational amplifier 620 may include a folded cascode gain circuit 621, an inverting gain circuit 622, etc.

A voltage transferred to the (−) input terminal of the operational amplifier 620 may be the first output voltage OUT 3 transferred from the first output terminal or may be the second output voltage OUT 4 transferred from the second output terminal.

A voltage transferred to the (−) input terminal of the operational amplifier 620 may be a voltage signal selected by a multiplexer 625 separately disposed outside the operational amplifier.

The folded cascode gain circuit 621 may be the same as or similar to the folded cascode gain circuit of FIGS. 4 and 5. The folded cascode gain circuit 621 may mean a circuit configuration in which a plurality of P type metal oxide semiconductor field effect transistors (MOSFETs) and a plurality of N type MOSFETs are connected. The P type MOSFET and the N type MOSFET may be defined as a P type transistor and an N type transistor, respectively, if necessary.

The folded cascode gain circuit 621 may have one end connected to a first voltage VDD or a second voltage GND, and may convert a voltage gain and transfer the converted voltage gain to the inverting gain circuit 622. For example, the first voltage VDD may be higher than the second voltage GND. Furthermore, the second voltage GND may mean a voltage having a ground state.

The inverting gain circuit 622 may mean a circuit configuration in which a P type transistor and an N type transistor are connected. One P type transistor and one N type transistor may constitute the inverting gain circuit, but the inverting gain circuit 622 may include several pairs of P type and N type transistors.

The inverting gain circuit 622 may be formed by connecting the folded cascode gain circuit 621 and the gate electrode, source electrode and drain electrode of each transistor.

The inverting gain circuit 622 may be connected to a conducting wire that forms the first voltage VDD or the second voltage GND, and may provide a source voltage. In this case, the source voltage and a drain voltage may be defined as different names depending on the size of the voltage.

If necessary, a line connected to the source electrode of the P type transistor may be defined as a first line LN1, a line connected to the gate electrode of the P type transistor may be defined as a second line LN2, a line connected to the source electrode of the N type transistor may be defined as a third line LN3, and a line connected to the gate electrode of the N type transistor may be defined as a fourth line LN4.

The inverting gain circuit 622 may be electrically connected to one or more nodes within the folded cascode gain circuit 621, and may provide a gate voltage thereto. A node to which the folded cascode gain circuit 621 and the gate electrode of a P type transistor of the inverting gain circuit 622 are connected may be defined as a node 1. A node to which the folded cascode gain circuit 621 and the gate electrode of an N type transistor of the inverting gain circuit 622 are connected may be defined as a node 2.

The inverting gain circuit 622 may form a plurality of output terminals by a plurality of transistor groups connected in parallel to the folded cascode gain circuit 621. In this case, the parallel connection may mean that a node to which the folded cascode gain circuit 621 and the inverting gain circuit 622 are connected is common.

The inverting gain circuit 622 may adjust an output voltage of the output terminal of the amplifier by multiplexers 623a and 623b disposed within the inverting gain circuit 622 so that a signal transferred to a transistor connected to the output terminal is selected. In this case, "disposed within the inverting gain circuit 622" may mean a circuit configuration disposed within a given range of an integrated circuit or may mean a circuit configuration disposed on a conducting wire that does not electrically form an end part.

For example, the multiplexer 623a may be physically or electrically connected between the node 1 and a node 3. Such a disposition may be defined as a disposition within the inverting gain circuit 622.

For another example, the multiplexer 623b may be physically or electrically connected between the node 2 and a node 4.

The multiplexers 623a and 623b may be independently controlled by a timing controller (not illustrated), and may be driven to select a required voltage according to a preset criterion. For example, the preset criterion may be for turning off the driving of the P type transistor or the N type transistor or reducing an output voltage.

The multiplexers 623a and 623b within the inverting gain circuit 622 may be connected to the transistors in a way to form the common nodes node 3 and node 4, respectively.

The type of adjusted voltage may be different depending on a location where the multiplexer 623a, 623b is disposed. If the multiplexer is connected to the source electrode of the transistor, the multiplexer may change a source voltage. If the multiplexer is connected to the drain electrode of the transistor, the multiplexer may change a drain voltage. If the multiplexer is connected to the gate electrode of the transistor, the multiplexer may control a gate voltage.

As the source voltage, the drain voltage or the gate voltage is changed, an output voltage OUT3, OUT4 of an output terminal of the operational amplifier formed between the P type transistor and the N type transistor may be changed.

The multiplexer 623a may select any one of a voltage of the node 1 and the first voltage VDD. The multiplexer 623b may select any one of a voltage of the node 2 and the second voltage GND.

The multiplexers within the inverting gain circuit 622 may be defined as a first multiplexer 623a and a second multiplexer 623b, and the type and number of multiplexers are not limited thereto.

The first multiplexer 623a may be connected to the P type transistor. The second multiplexer 623b may be connected to the N type transistor. The first multiplexer 623a and the second multiplexer 623b may independently control output voltages of the amplifier.

As voltages at the nodes node 3 and node 4 of the first multiplexer 623a and the second multiplexer 623b, respectively, are changed, a current between the P type transistor and the N type transistor may be controlled. The output voltages OUT3 and OUT4 of the operational amplifier may be differently outputted.

For example, as disclosed in FIG. 12, an input voltage for each node may be differently applied for a high impedance operation.

Figure 9:
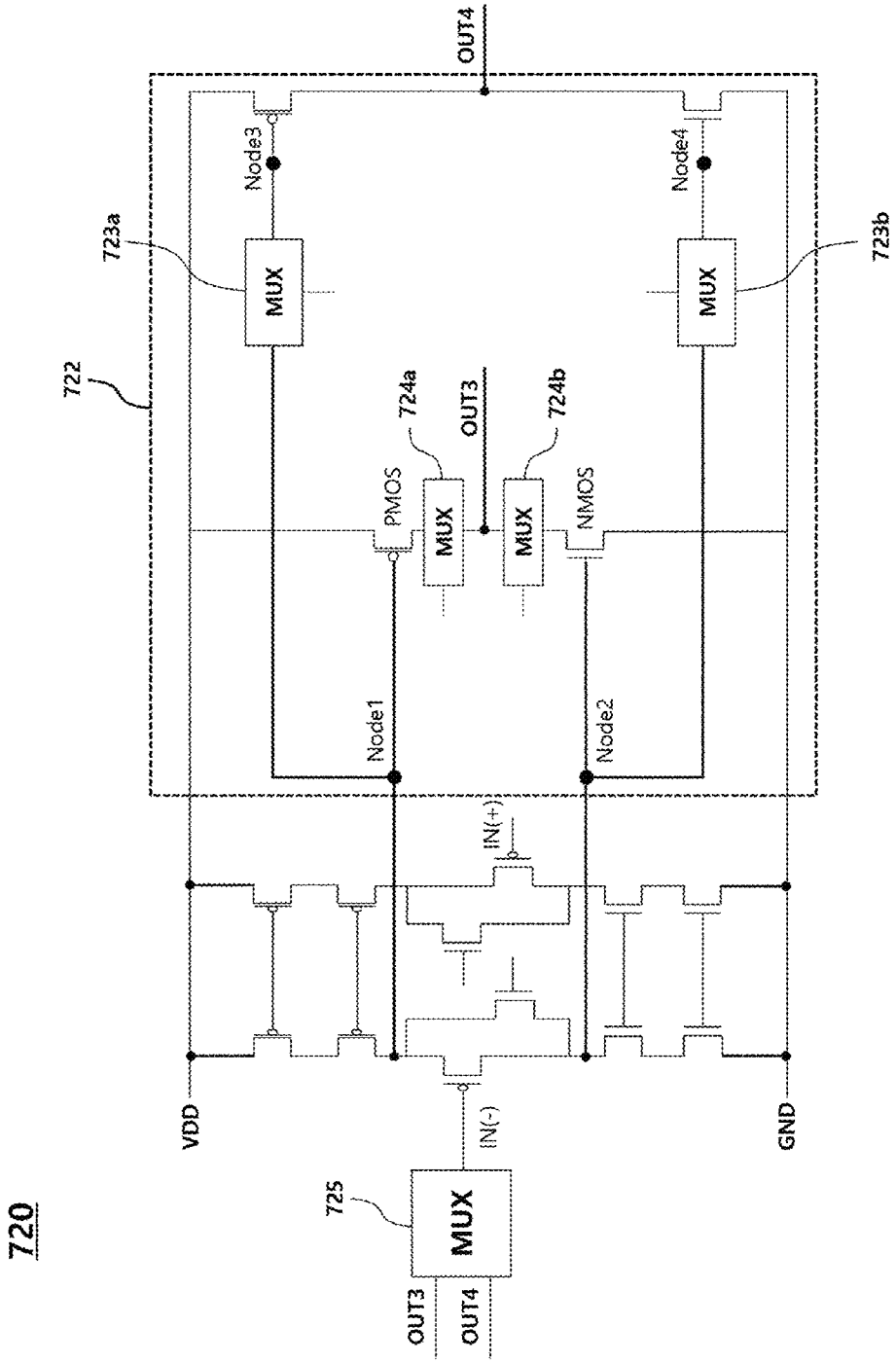
FIG. 9 is a second example circuit diagram illustrating an operational amplifier within a data driving circuit according to an embodiment.

FIG. 9 is a second example circuit diagram illustrating an operational amplifier within a data driving circuit according to an embodiment.

Referring to FIG. 9, an operational amplifier 720 may include an inverting gain circuit 722, etc.

A multiplexer 723a disposed between a node 1 and a node 3 and a multiplexer 723b disposed between a node 2 and a node 4 may be the same as the multiplexers 623a and 623b of FIG. 8, respectively.

According to an embodiment, multiplexers 724a and 724b may be disposed between respective transistors and an output terminal. In this case, an output voltage OUT3 of the output terminal of the operational amplifier 720 may be controlled by controlling a source voltage or drain voltage of the transistor even without changing a gate voltage of the transistor. For example, the multiplexers 724a and 724b may play a role as a switch, and can reduce power consumption used within the operational amplifier 720 in a simpler way by blocking a voltage or a current transferred to the output terminal.

According to an embodiment, the multiplexers 723a and 723b may control an output voltage OUT4, and the multiplexers 724a and 724b may control the output voltage OUT3.

The multiplexers 724a and 724b may not be used if a state of the other output terminal is a high impedance state.

More efficient high impedance driving is made possible because the output voltages OUT3 and OUT4 are primarily controlled by the multiplexers 723a, 723b and 724a, 724b and secondarily controlled by a multiplexer 725 outside the operational amplifier 720.

Figure 10:
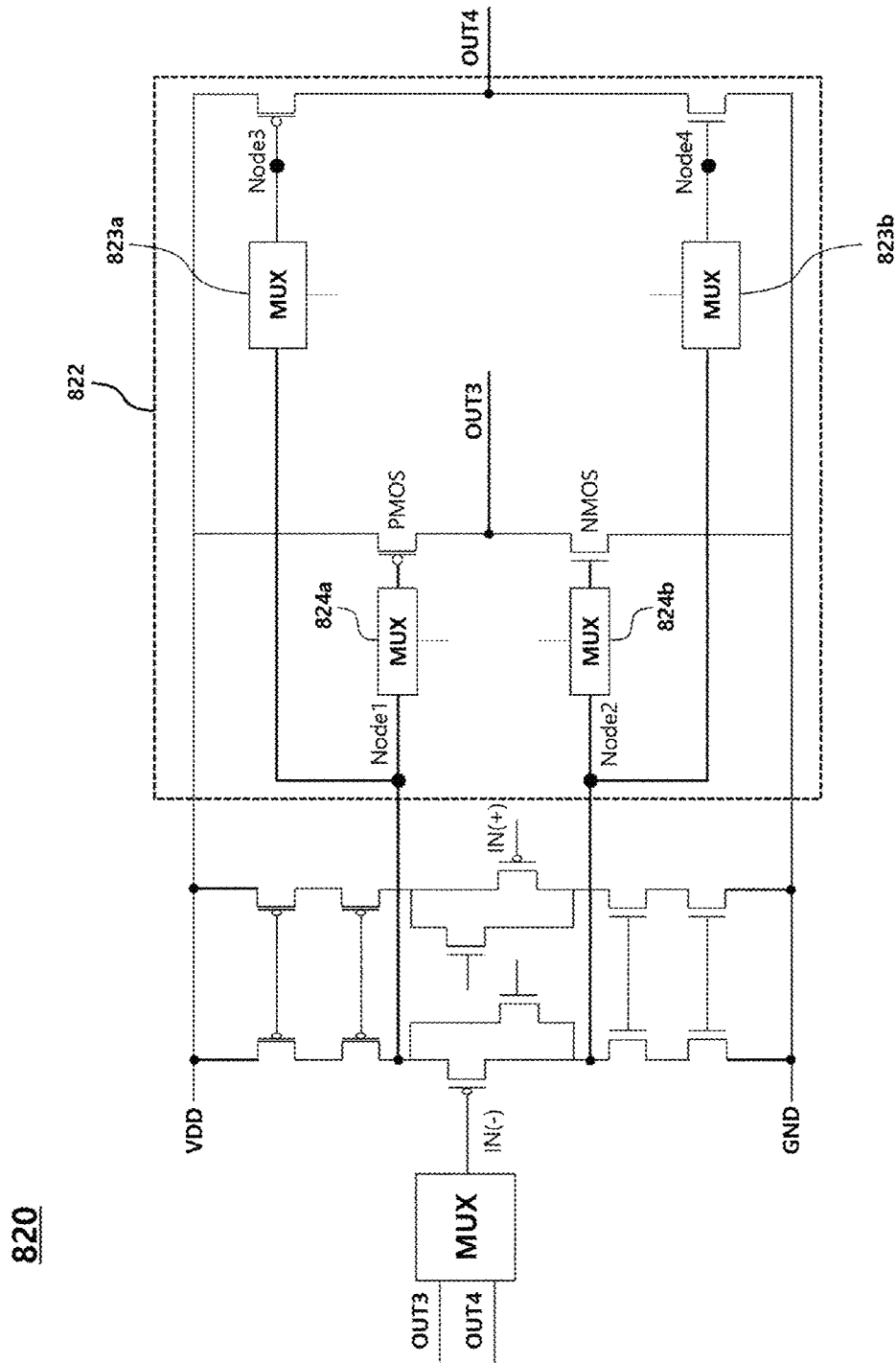
FIG. 10 is a third example circuit diagram illustrating an operational amplifier within a data driving circuit according to an embodiment.

FIG. 10 is a third example circuit diagram illustrating an operational amplifier within a data driving circuit according to an embodiment.

Referring to FIG. 10, an operational amplifier 820 may include an inverting gain circuit 822, etc.

A multiplexer 823a disposed between a node 1 and a node 3 and a multiplexer 823b disposed between a node 2 and a node 4 may be the same as the multiplexers 623a and 623b of FIG. 8, respectively.

In an embodiment, in the inverting gain circuit 822 having a parallel structure, transistor groups may have circuit configurations having the same disposition. Multiplexers 824a and 824b may be connected to gate electrodes of a P type transistor and an N type transistor, respectively, and may control gate voltages.

According to an embodiment, the multiplexers 823a and 823b may control an output voltage OUT4, and the multiplexers 824a and 824b may control an output voltage OUT3.

FIG. 11 is a first example diagram illustrating the type of operation of a data driving circuit according to an embodiment.

Referring to FIG. 11, an operation 900 of the inverting gain circuit of the data driving circuit may be divided into a normal operation and a high impedance operation.

FIG. 11 may illustrate voltage changes in the node 1 and the node 2 in the circuit diagrams of FIGS. 8 to 10, for example, but the present disclosure is not limited thereto.

In FIGS. 8 and 9, voltages transferred to the node 1 and the node 2 cannot be freely changed because the gate electrodes of the transistors that generate the output voltage OUT 3 are not connected to the multiplexers. In FIG. 10, voltages transferred to the node 1 and the node 2 can be changed through the multiplexers because the gate electrodes of the transistors are connected to the multiplexers.

According to the conventional inverting gain circuit having the pair of P type transistor and N type transistor, a situation in which a voltage having a high (H) state in the node 1 is applied to the P type transistor and a voltage having a low (L) state in the node 2 is applied to the N type transistor cannot occur.

The reason for this is that a state of the P type transistor corresponds to an off state if a voltage having the high (H) state in the node 1 is applied to the P type transistor, and a state of the N type transistor also corresponds to the off state if a voltage having the low (L) state in the node 2 is applied to the N type transistor.

The inverting gain circuit according to an embodiment has the circuit configuration having the plurality of output terminals and thus can perform a high impedance operation of FIG. 12 in the node 3 and the node 4 even in a situation in which a voltage having the high (H) state in the node 1 is applied to the P type transistor and a voltage having the low (L) state in the node 2 is applied to the N type transistor.

If a voltage having the low (L) state in the node 1 is applied to the P type transistor and a voltage having the low (L) state in the node 2 is applied to the N type transistor, the existing driving can be maintained. If a voltage having the low (L) state in the node 1 is applied to the P type transistor and a voltage having the high (H) state in the node 2 is applied to the N type transistor, the existing driving can be maintained. If a voltage having the high (H) state in the node 1 is applied to the P type transistor and a voltage having the high (H) state in the node 2 is applied to the N type transistor, the existing driving can be maintained.

The voltage having the high (H) state and transferred to the node 1 and the node 2 according to an embodiment may be the first voltage VDD, and the voltage having the low (L) state and transferred to the node 1 and the node 2 according to an embodiment may be the second voltage GND, but the present disclosure is not limited thereto.

The voltages transferred to the node 1 and the node 2 may be different depending on the type and state of a voltage transferred to the input terminal.

FIG. 12 is a second example diagram illustrating the type of operation of a data driving circuit according to an embodiment.

Referring to FIG. 12, an operation 1000 of the inverting gain circuit of the data driving circuit may be divided into a normal operation and a high impedance operation.

The inverting gain circuit according to an embodiment has the circuit configuration having the plurality of output terminals and thus can perform the high impedance operation of FIG. 12 in the node 3 and the node 4 even in a situation in which a voltage having the high (H) state in the node 1 is applied to the P type transistor and a voltage having the low (L) state in the node 2 is applied to the N type transistor.

An inverting gain circuit having a plurality of pairs of P type transistors and N type transistors according to another embodiment can implement high impedance depending on states of voltages transferred to the node 3 and the node 4 in response to a separate control signal.

If a voltage having the high (H) state in the node 3 is applied to the P type transistor and a voltage having the high (H) state in the node 4 is applied to the N type transistor, a quiescent current can be blocked in a way to output a ground voltage or a low voltage.

An unnecessary current can be blocked by controlling the output of the other pair of transistor groups only when any one pair of transistor groups operates normally.

In the inverting gain circuit, a voltage having the high (H) state in the node 3 may be applied to the P type transistor and a voltage having the high (H) state in the node 4 may be applied to the N type transistor by the multiplexer only in a situation in which a voltage having the high (H) state in the node 1 is applied to the P type transistor and a voltage having the low (L) state in the node 2 is applied to the N type transistor.

Figure 13:
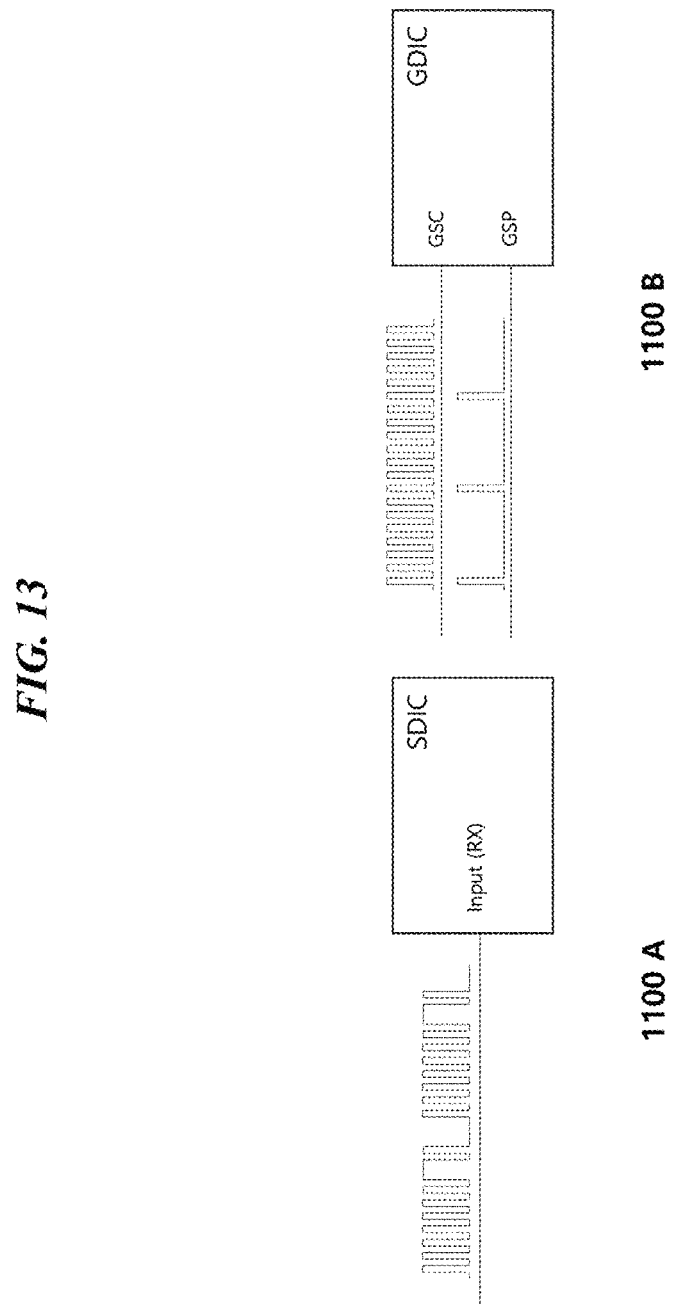
FIG. 13 is a diagram for comparing operations of a data driving circuit and a gate driving circuit.

FIG. 13 is a diagram for comparing operations of a data driving circuit and a gate driving circuit.

Referring to FIG. 13, an operation 1100A of the data driving circuit and an operation 1100B of the gate driving circuit may be compared.

In the operation 1100A of the data driving circuit, the data driving circuit may receive a differential signal having a specific protocol form having a predetermined format. In this case, the differential signal received by the data driving circuit may include information on a clock, output data, whether a high impedance operation is used, etc.

In contrast, in the operation 1100B of the gate driving circuit, required specific signals, such as a gate signal clock GSC and a gate start pulse GSP, are directly inputted.

Figure 14:
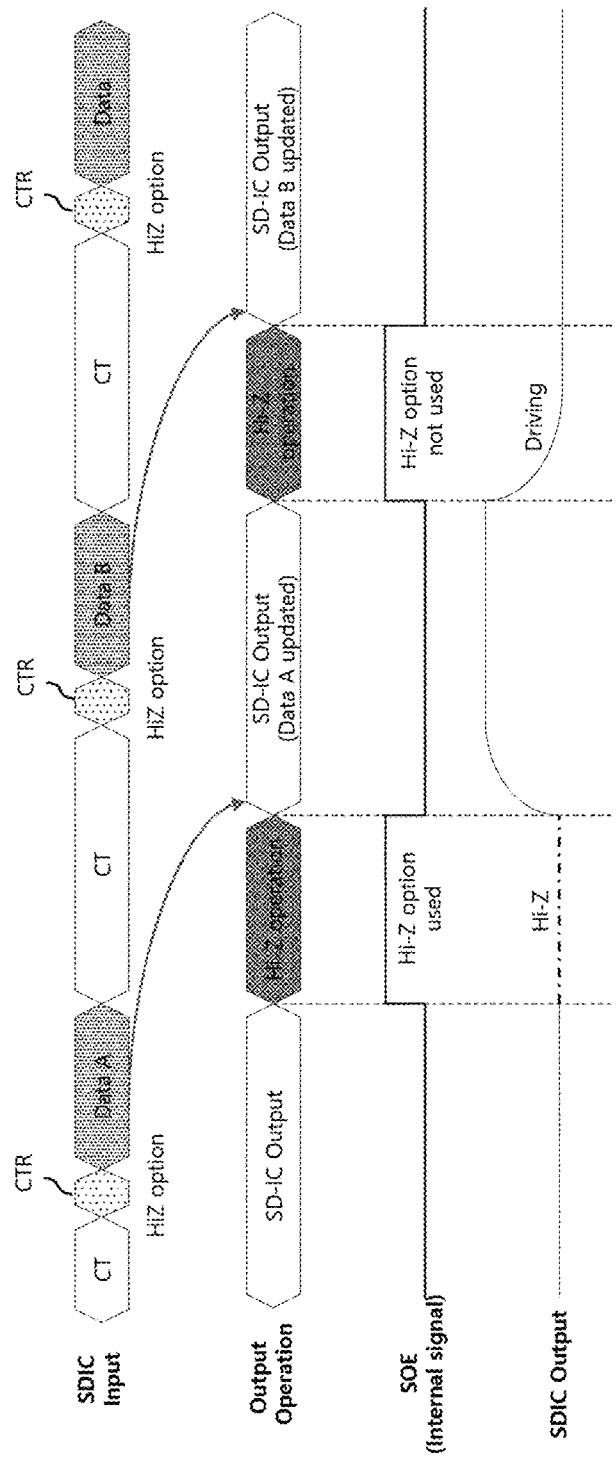
FIG. 14 is a diagram for describing a high impedance driving method according to an embodiment.

FIG. 14 is a diagram for describing a high impedance driving method according to an embodiment.

Referring to FIG. 14, the data driving circuit may receive a control signal having different information for each time section.

For example, the data driving circuit may receive information, such as a clock training CT, a control packet CTR, and protocol information, for each divided time section.

The control packet CTR may include a control signal of an amplifier, a high impedance driving signal, etc.

A source output enable signal SOE may include a high impedance use signal.

According to an embodiment, if the high impedance function is used, the output of the data driving circuit may not be generated because the high impedance function is executed after rising timing at which a signal is started. The output of the data driving circuit may be generated in the form of a log function after falling timing at which a high impedance signal is ended.

What is claimed is:

1. A data driving integrated circuit comprising:
a digital to analog converter (DAC) configured to change a digital signal into an analog signal; and
an amplifier configured to generate a data voltage through a folded cascode gain circuit and an inverting gain circuit by using the analog signal received through an input terminal of the amplifier and to output the data voltage through an output terminal,
wherein the folded cascode gain circuit receives, as feedback, one of a plurality of output voltages from a plurality of output terminals of the amplifier, and
the inverting gain circuit receives an output signal of the folded cascode gain circuit and changes an output signal from a multiplexer, which is transferred to a transistor connected to an output terminal of the amplifier through the multiplexer disposed in the inverting gain circuit.

2. The data driving integrated circuit of claim 1, wherein the multiplexer in the inverting gain circuit is connected to the transistor in a way to share a node with the transistor and the output signal from the multiplexer controls a source voltage, drain voltage or gate voltage of the transistor.

3. The data driving integrated circuit of claim 1, wherein the multiplexer changes a gate voltage transferred to the transistor and changes an output voltage of the amplifier based on a set criterion.

4. The data driving integrated circuit of claim 1, wherein the multiplexer comprises a first multiplexer and a second multiplexer, wherein the first multiplexer is connected to a P type transistor, the second multiplexer is connected to an N type transistor, and the first multiplexer and the second multiplexer independently control output voltages of the amplifier.

5. The data driving integrated circuit of claim 1, wherein the inverting gain circuit comprises a P type transistor and an N type transistor and changes an output voltage of the amplifier by controlling a current between the P type transistor and the N type transistor, wherein a multiplexer connected to the N type transistor transfers a ground voltage to the N type transistor.

6. The data driving integrated circuit of claim 1, wherein the inverting gain circuit comprises a plurality of output terminals formed by a plurality of transistor groups connected in parallel.

7. The data driving integrated circuit of claim 1, further comprising an external multiplexer configured to select one or more of voltages outputted through the output terminal of the amplifier and to provide a feedback voltage to the input terminal of the amplifier.

8. The data driving integrated circuit of claim 1, wherein:
the amplifier comprises a first output terminal and a second output terminal,
wherein one line connected to the first output terminal transfers a data voltage to a pixel and the other line transfers a data voltage to an external multiplexer,
wherein a line connected to the second output terminal transfers a data voltage to the external multiplexer, and
wherein the external multiplexer selects any one of the data voltage transferred from the first output terminal and the data voltage transferred from the second output terminal.

9. An operational amplifier circuit comprising operational amplifiers, wherein
an operational amplifier comprises a plurality of output terminals configured to transfer data voltages, and
each of the plurality of output terminals comprises:
a P type transistor having a source electrode connected to a first line and a gate electrode connected to a second line; and
an N type transistor having a source electrode connected to a third line and a gate electrode connected to a fourth line,
wherein a node, formed by the connection between the P type transistor and the N type transistor, becomes an output voltage path,
wherein an output voltage of each output terminal is controlled by multiplexers disposed respectively in the second line and in the fourth line.

10. The operational amplifier circuit of claim 9, wherein a multiplexer controls an output voltage of an output terminal by receiving a signal for controlling the P type transistor or the N type transistor.

11. The operational amplifier circuit of claim 9, wherein a multiplexer is connected to the P type transistor or the N type transistor and selects a voltage transferred to the P type transistor or the N type transistor.

12. The operational amplifier circuit of claim 9, wherein the operational amplifier comprises a first output voltage path for transferring a feedback voltage to an input terminal of the operational amplifier and a second output voltage path for transferring a data voltage to a pixel.

13. The operational amplifier circuit of claim 9, wherein:
one of the plurality of output terminals is electrically connected to an external multiplexer disposed outside the operational amplifier and
another of the plurality of output terminals is electrically connected to the external multiplexer and also connected to a plurality of pixels so as to transfer data voltages.

14. An operational amplifier circuit comprising:
a first multiplexer configured to select an input voltage transferred to an operational amplifier circuit through a (−) terminal of an input terminal;
a folded cascode gain circuit connected to the (−) terminal and a (+) terminal of the input terminal and configured to change a gain of the input voltage;
a first inverting gain circuit configured to generate an output voltage by transferring, to a first transistor, a voltage transferred from the folded cascode gain circuit; and
a second inverting gain circuit configured to share a voltage node with the first inverting gain circuit and comprising a second multiplexer that changes a voltage transferred to a second transistor.

15. The operational amplifier circuit of claim 14, wherein an output voltage of an output terminal of the operational amplifier circuit is controlled by a third multiplexer connected to the first transistor.

* * * * *